United States Patent [19]

Peterson

[11] Patent Number: 4,651,203
[45] Date of Patent: Mar. 17, 1987

[54] VIDEO CONTROLLED ARTICLE POSITIONING SYSTEM

[75] Inventor: Karl E. Peterson, Mohnton, Pa.

[73] Assignee: AT&T Technologies, Inc., Berkeley Heights, N.J.

[21] Appl. No.: 792,546

[22] Filed: Oct. 29, 1985

[51] Int. Cl.$^4$ .................... H04N 7/00; H04N 7/18
[52] U.S. Cl. .................... 358/101; 358/107; 356/399; 364/559; 901/47
[58] Field of Search .................... 358/101, 107, 93; 356/375, 399; 364/559; 901/47

[56] References Cited

U.S. PATENT DOCUMENTS

| | | | |
|---|---|---|---|
| 3,749,830 | 7/1973 | Blitchington, Jr. | 358/101 |
| 3,814,845 | 6/1974 | Hurlbrink, III et al. | 358/101 |
| 3,899,634 | 8/1975 | Montone et al. | 358/101 |
| 3,903,363 | 9/1975 | Montone et al. | 358/101 |
| 3,988,535 | 10/1976 | Hickman et al. | 358/101 |
| 4,203,132 | 5/1980 | Schmitt et al. | 358/101 |
| 4,212,031 | 7/1980 | Schmitt et al. | 358/101 |
| 4,238,780 | 12/1980 | Doemens | 382/8 |
| 4,301,470 | 11/1981 | Pagany | 358/101 |
| 4,319,272 | 3/1982 | Henry | 358/107 |
| 4,328,553 | 5/1982 | Fredriksen et al. | 364/559 |
| 4,364,086 | 12/1982 | Guth | 358/101 |
| 4,390,955 | 6/1983 | Arimura | 364/490 |

*Primary Examiner*—James J. Groody
*Assistant Examiner*—Michael D. Parker
*Attorney, Agent, or Firm*—Wendy W. Koba

[57] ABSTRACT

Apparatus and method for positioning an article utilizes a video signal of the article from a television camera to accurately position the article. Vertical and horizontal sync signals from the camera are used to generate first and second boundary markers to provide $\pm X$ and $\pm Y$ positioning, respectively. Sensitivity markers are also generated to monitor system sensitivity in non-object areas. The magnitude of the coincidence between the article and the boundary markers is utilized to control the motion of the positioning adjustment.

16 Claims, 6 Drawing Figures

FIG.6
HORIZONTAL ZONE GENERATOR

VIDEO CONTROLLED ARTICLE POSITIONING SYSTEM

BACKGROUND OF THE INVENTION

1. Field of the Invention

The present invention relates to a video controlled article positioning system and, more particularly, to a system for positioning articles such as beam leaded integrated circuits, beam leaded diodes, etc. During manufacturing processes, the articles must be accurately positioned so that multiprobes, bonding tools, etc. may accurately engage contact leads or other portions of each article. The invention utilizes bidirectional video markers and a system of controlling the positioning speed so as to most efficiently position the articles.

2. Description of the Prior Art

In the past, a wide variety of techniques have been used to position articles with varying degrees of precision. Among the simpler of these techniques are the manual positioning systems utilizing a microscope with cross hairs or similar indicia rigidly fixed in the optics. Suitable positioning mechanisms, such as manually operated wormscrews, are operated to move a stage upon which the article is placed to accurately position the article in alignment with the cross hairs. In operations where small quantities of articles of simple geometry are being handled, these systems are excellent both economically and in performance, but as the articles become more complex in detail or larger quantities are handled, these systems become slow, costly, tedious and questionable in results.

Other prior art techniques utilize photocell or photomultiplier tubes which sense various portions of the article for reflected or transmitted light to control voltages to motors which drive a movable stage. Such systems, while sorting well with large articles or articles having a simple geometry, are not readily adapted to positioning articles which are microscopic in dimension or complex in geometry. Also, varying reflectivity and/or absorbency characteristics of articles cause such systems to operate with less accuracy.

Prior art systems also exist which utilize video signals generated by television cameras for positioning articles. One class of television positioning systems, utilizes a computer to compare various portions of the field with a programmed memory. The field is divided into many subdivisions. The presence or absence of a video signal in each subdivision is compared to the programmed memory to produce signals to position the articles. Such systems are complex and expensive where very accurate positioning is required.

Another class of prior art television positioning systems uses various phase characteristics of the video signal to center an article with respect to the television camera. While such systems are useful, they do not generally produce the accuracy that is necessary for small and complex articles.

One such prior art television positioning system is described in U.S. Pat. No. 3,749,830 issued to F. H. Blitchington on July 31, 1973. This system senses an article or pattern associated with the article to produce a first pulse having a time relationship relative to the horizontal and vertical sync pulses indicating the actual position of the article. A timing circuit controlled by the vertical and horizontal sync pulses generates vertical cross hair pulses and horizontal cross hair pulses to which the first pulse is compared. The article is moved until the first pulse has a predetermined time relationship to the vertical and horizontal cross hair pulses.

An improvement over the Blitchington system is described in U.S. Pat. No. 3,899,634 issued to L. J. Montone et al on Aug. 12, 1975. Vertical and horizontal sync signals from a camera are used to generate boundary markers. An edge of each boundary marker indicates a limit for an edge of the article. A coincidence of a boundary marker signal and the video signal of the article causes the article to be moved until there is no coincidence. A problem with the Montone et al arrangement is that the motor drive circuit used to move the article will always send a signal to the motor having the same voltage level. Consequently, a corrective motor always moves the article at the same speed. Therefore, large corrections require an unsuitably large time length for corrections. When the system speed is increased to overcome this deficiency, however, the motor will overshoot for small corrections.

Therefore, a need remains in the prior art for an article positioning system which may be utilized with articles having microscopic dimensions, is fairly simple in operation, and is capable of self-adjusting for either large or small positioning corrections.

SUMMARY OF THE INVENTION

The problem remaining in the prior art has been solved in accordance with the present invention which relates to a video controlled article positioning system utilizing bidirectional video markers and a system of controlling the positioning speed so as to most efficiently positioning the articles.

An object of the invention is a new and improved method and apparatus utilizing television video signals for positioning articles.

Another object of the invention is a positioning method and apparatus wherein the edges of the articles are detected by a generated zone and the amount of coincidence is determined by multiple scans of the object area to accurately position the article.

In accordance these and other objects, the invention includes sensing a coincidence of a video signal of the article and a video signal of a zone marker to move the article until the video signal of the article and the video of the zone met specific requirements. Thus, an article can be bidirectionally positioned along an axis using a single zone marker.

Additionally, the invention utilizes a zone having predetermined horizontal and vertical dimensions for positioning the article in a first direction and a second zone having predetermined horizontal and vertical dimensions for positioning the article in a second direction. The article is initially positioned so that the video signal of the article coincides with both the video signals of the first and second zones. Movement of the article in the first and second directions until the video signals of the first and second zones coincide by a specified amount with the video signal of the article results in the article being accurately positioned.

Further, the invention utilizes a plurality of zones for positioning the article in the X and Y directions. Additionally, the invention utilizes adjoining zones to establish the sensitivity for each detection zone.

BRIEF DESCRIPTION OF THE DRAWINGS

Referring now to the drawings, where like numerals represent like parts in several views.

DETAILED DESCRIPTION

Figure 1:
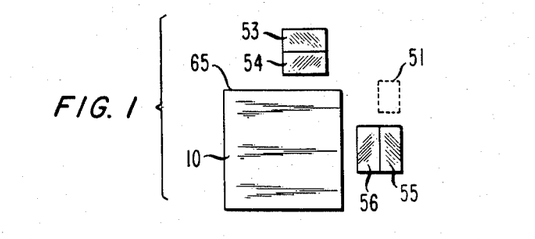
FIG. 1 illustrates an article which may be positioned in accordance with the present invention.

Referring to FIG. 1, there is shown an article 10, which represents a device or object to be positioned. To the right of article 10 is illustrated a horizontal zone position market 56 and its associated horizontal zone sensitivity marker 55. As described in detail hereinafter, bidirectional horizontal (+X and −X) movement of article 10 is provided by sensing either the gap between edge 64 of article 10 and marker 56 (indicating +X movement is needed) or overlap beween edge 64 and marker 56 (indicating −X movement is needed). Also illustrated is a vertical zone position marker 54 and a vertical sensitivity marker 53. Bidirectional vertical (+Y and −Y) movement of article 10 is provided in a similar manner as the +X, −X movement.

Figure 2:
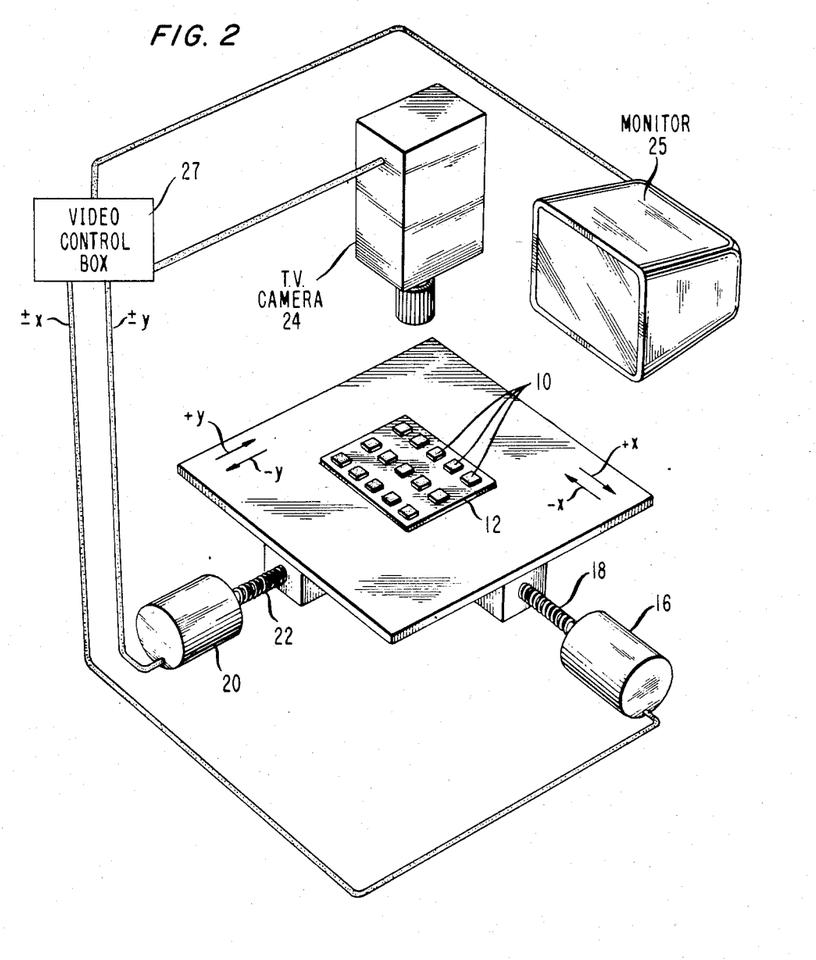
FIG. 2 illustrates a system for positioning articles in accordance with the present invention.

Referring to FIG. 2, there is shown an apparatus for accurately positioning a plurality of articles 10—10 relative to equipment (not shown), such as bonding tools, testing probes, pickup devices, etc. A plurality of the articles 10—10 are positioned on a holder 12 which is held on a table 14 by facilities such as a vacuum chuck. X—Y table 14 is moved in the X direction by a motor 16 and lead screw 18. Similarly, table 14 is moved in the Y direction by a motor 20 and lead screw 22. Positioning motors and lead screw arrangements are well known in the art.

A television camera 24 is positioned over table 14 to view one, or more, of the articles 10 on holder 12. The specific article viewed by camera 24 is displayed on a suitable monitor 25. Camera 24 may be any conventional television camera, such as a model TC2021 sold by RCA, Inc. of Lancaster, Pa., which produces a composite video signal. Also, camera 24 is equipped with a lens or optical system to produce a suitably enlarged representation of article 10. Monitor 25 may be any suitable monitor which will accept composite video and display the image, such as a model VM-29 sold by Hitachi of Japan. A video control circuit 27 uses the composite video signal from camera 24 to precisely control the position of article 10 and display the resultant image on monitor 25.

Figure 3:
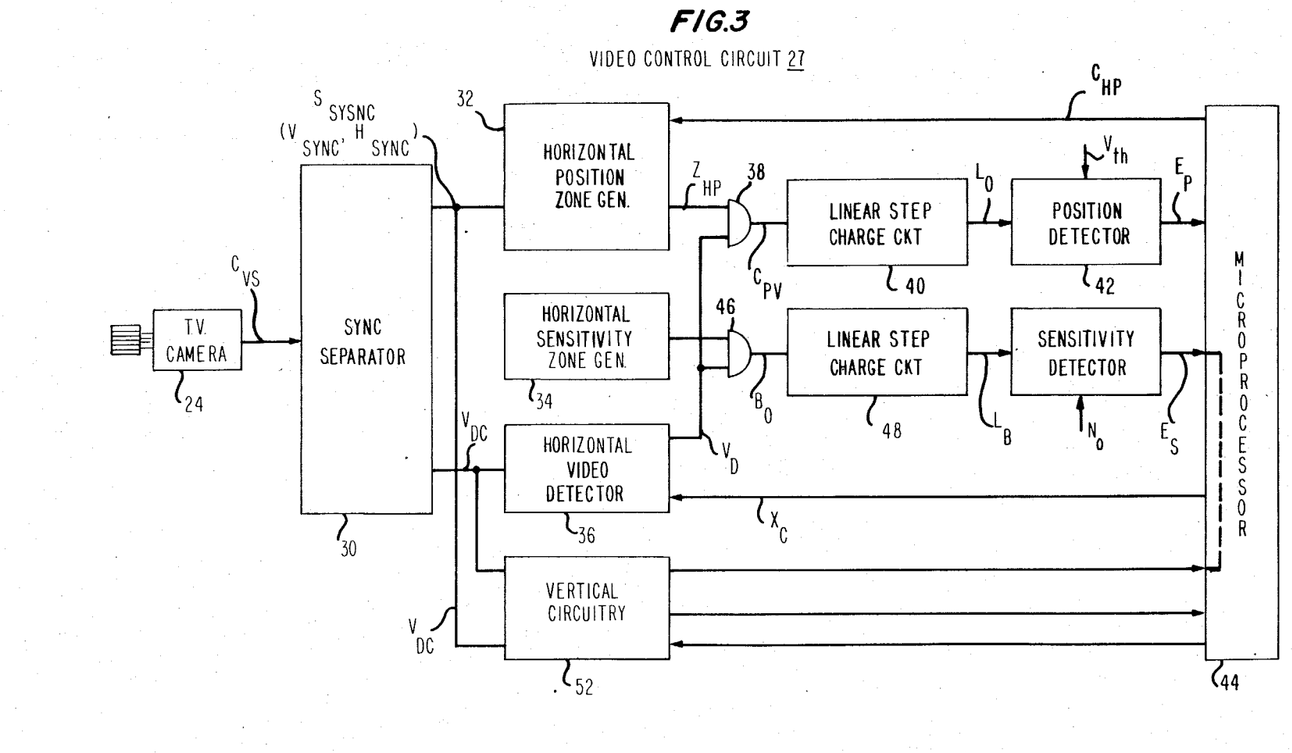
FIG. 3 is a block diagram of the video control circuit of the system shown in FIG. 2.

Referring to FIG. 3, there is shown a block diagram of video control circuit 27 referred to above in association with FIG. 2. Composite video signal $C_{VS}$ from camera 24 is DC restored and applied as an input to a sync separator 30 which derives both the horizontal sync pulse $H_{sync}$ and the vertical sync pulse $V_{sync}$ as well as the video signal $V_{DC}$. Such circuitry is conventional and well known to those skilled in the art and no further description is deemed necessary. Synchronization signals $H_{sync}$ and $V_{sync}$ are subsequently applied as inputs to both a horizontal position zone generator 32 and a horizontal sensitivity zone generator 34. These generators produce adjoining zones, the first, denoted $Z_{HP}$, to establish a horizontal positioning reference and the second, denoted $Z_{HS}$, to establish horizontal zone sensitivity. Zone generators 32 and 34 will be described in detail hereinafter in association with FIG. 6.

The DC restored video signal $V_{DC}$ derived by sync separator 30 is subsequently applied as an input to a video level shifter and detector 36 which produces a detected video signal $V_D$. Detected video signal $V_D$ is controlled in detection level by a control signal $X_C$ generated by a microprocessor 44. Control signal $X_C$ functions to control both the sensitivity of horizontal video detector 36 and the resultant detected video signal $V_D$. Video signal $V_D$ is then applied as an input to an AND gate 38 and is logically ANDed with horizontal zone positioning pulse $Z_{HP}$ to produce an output signal $C_{PV}$ which represents the coincidence between the horizontal position zone and the video signal representation of object 10 which is being positioned.

In accordance with the present invention, coincidence signal $C_{PV}$ is applied as an input to a linear step charge circuit 40, the output of which, denoted $L_O$, represents the summation of the time dependent signals $C_{PV}$. Linear step charge output signal $L_O$ is a staircase signal with respect to time, where the step size represents the amount of coincidence beween the horizontal position zone and the article i.e., the greater the amount of coincidene the larger the step. The term "amount", is used here to define the time interval (horizontal) between the appropriate boundary zone and the closest edge of the article or the number of lines of raster (vertical) between the appropriate boundary zone and the closest edge of the article. Linear step charge output signal $L_O$ is subsequently applied as an input to a position detector 42. When linear step charge signal $L_O$ reaches a predetermined threshold voltage $V_{th}$, a position error signal $E_P$ is generated by detector 42 and applied as an input to microprocessor 44. Therefore, by determining the amount of elapsed time (for horizontal zones) or number of lines of raster (for vertical zones) for signal $L_O$ to reach threshold value $V_{th}$, the amount of positioning error $E_P$ is established and the X motor drive logic (not shown) is controlled to correct the error. As described in detail hereinafter signal $E_p$ will have a first value when the article needs to be moved to the right to coincide with marker 56, a second value when edge 64 and marker 56 coincide, and a third value when the article overlaps marker 56 and needs to be moved to the left. The magnitude of signal $E_p$ is representative the total amount of movement required. Thus, a relatively small adjustment will cause motor 20 to slowly move article 10. Similarly, a large adjustment will cause motor 20 to more rapidly move article 10. Likewise, +Y and −Y adjustments are made with identical circuitry dedicated to vertical direction movement.

Maintaining the proper sensitivity is very important in the process of the present invention since in most applications there will be illuminating light level variations, changes in surface reflectivity, etc. Referring to FIG. 3, additional components are included to maintain a predetermined sensitivity level. As described above, horizontal zone sensitivity generator 34 produces a sensitivity zone 55 adjacent to horizontal positioned zone 56, as illustrated in FIG. 1. Thus, the sensitivity can be controlled in the specific area where the positioning determination is made. In accordance with the present invention, output pulse $Z_{HS}$ from horizontal sensitivity zone generator 34 is applied as a first input to an AND gate 46, where the second input is the detected video signal $V_D$. The output of AND gate 46, denoted $B_O$, is thus representative of the background level of a non-object area (i.e., a white area) represented by the numeral 51 in FIG. 1. Background level output signal $B_O$ is then applied as an input to a linear step charge circuit 48 to produce as an output a linear step charge signal $L_B$. Linear step charge output signal $L_B$ is subsequently applied as an input to a sensitivity detector 50, which in accordance with the present invention comprises a lesser level of sensitivity than position detector 42 described above. That is, detector 50 utilizes a lower threshold voltage $N_O$ than threshold voltage $V_{th}$ of position detector 42. Sensitivity detector 50 output signal $E_S$ is then applied as an input to microprocessor 44, providing a time dependent signal representing an illumination level for a non-object area. Sensitivity detector output signal $E_S$ is used by microprocessor 44 to control the sensitivity of horizontal video detector 36 by means of control signal $X_C$ defined above. Therefore, a technique is disclosed for controlling the sensitivity and positioning of an object along the horizontal, or X, axis.

Vertical circuitry, shown as block 52 in FIG. 3, is identical to the horizontal circuitry described above, with the exception of the placement of the sensitivity zones. Referring to FIG. 1, vertical sensitivity zone 53 is positioned above vertical positioning zone 54, where horizontal sensitivity zone 55 is positioned to the right of horizontal positioning zone 56.

In accordance with the practice of the present invention, microprocessor 44 may be any arrangement capable of accepting input logic signals for controlling horizontal and vertical sensitivities, and input horizontal and vertical motor drive logic signals to precisely position an object. Additional functions include video storage to retain an image for inspection and the ability to accept control signals from an external source to allow minor alterations in the zone positions. Control signal $C_{HP}$ is shown and provides control of horizontal position zone generator 32. As described later in association with FIG. 6, control signal $C_{HP}$ is used to automatically align the system to match an existing object and for minor adjustments to the zone position after the system is in operation.

Figure 4:
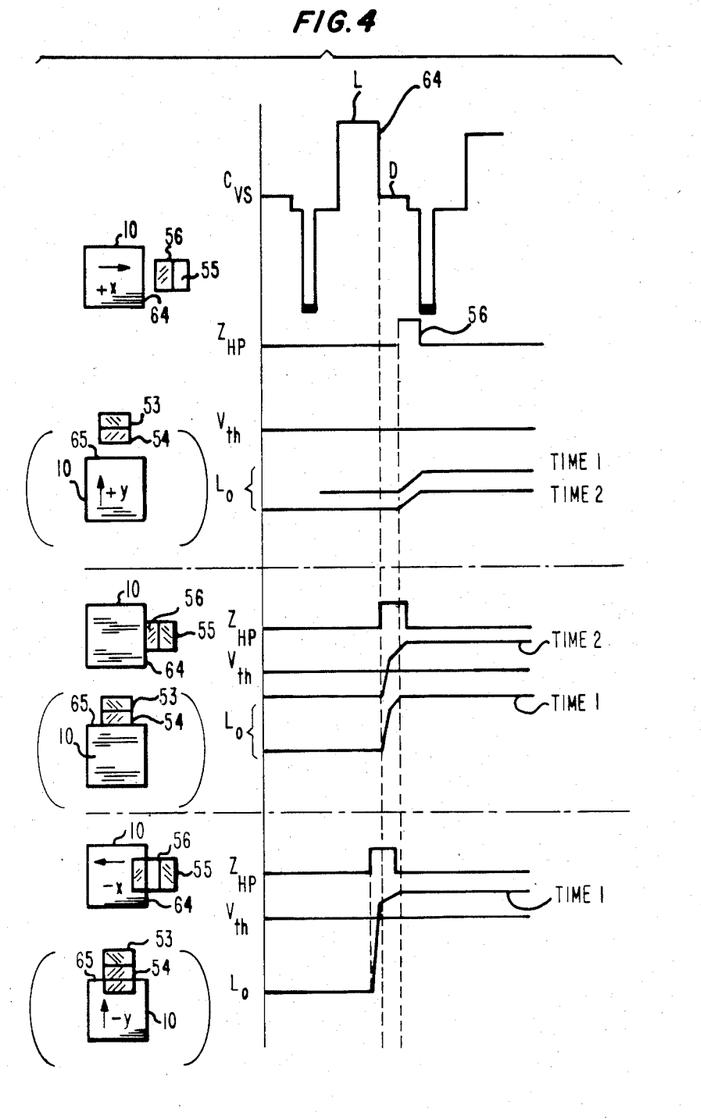
FIG. 4 illustrates wave forms generated by various positions of the article of FIG. 1.

FIG. 4 illustrates three sets of positioning waveforms for different system conditions. Composite video signal $C_{VS}$ comprises a light signal level L, a dark signal level D, and horizontal sync pulses $H_{sync}$. A horizontal position zone generator pulse $Z_{HP}$ representing horizontal zone 56 is positioned to the right of the L-D transition, where the L-D transition represents the right edge 64 of article 10. With the absence of coincidence between edge 64 and zone 56, linear step charge circuit 40 (shown in FIG. 3) will receive a low input signal and will thus charge at a low rate. Therefore, at the end of the first frame, as indicated in FIG. 4, output signal $L_O$ from linear step charge circuit 40 will not reach the threshold value $V_{th}$. As seen by reference to FIG. 4, output signal $L_O$ does not reach $V_{th}$ by the end of the second frame either. Therefore, the output signal $E_P$ from position detector 42, as received by microprocessor 44, will send a signal to the horizontal drive motor to move article 10 in the forward X direction (to the right). Referring to the next case illustrated in FIG. 4, edge 64 of article 10 is seen to coincide with zone 56. Therefore, input signal $C_{PV}$ to linear step charge circuit 40 will produce an output signal $L_O$ which exceeds the threshold value $V_{th}$ by the end of the second frame. In response to this condition, error signal $E_P$ sent to microprocessor 44 will indicate that no movement is required. In the last case, zone 56 is seen to encroach article 10 beyond edge 64. Thus, the arrival of pulse $Z_{HP}$ before signal $V_D$ at AND gate 38 will provide a series of pulses $C_{PV}$ which, when applied to linear step charge circuit 40, will produce an output signal $L_O$ which has a large step size and thus exceeds threshold $V_{th}$ before the end of the first frame. This subsequent large value for $E_P$ will cause microprocessor 44 to generate a motor drive signal to move object 10 in the reverse X direction (to the left). In summary, therefore, a single zone 56 is being used in accordance with the present invention for bidirectional ($+X$ and $-X$) positioning capability along an axis using time dependent measurements. The system of the present invention can thus replace that of the prior art which used two separate boundaries for $+X$ and $-X$ adjustments. As discussed above, the magnitude of signal X sent by microprocessor 44 to motor 16 is utilized to control the motion of motor 16 so as to most efficiently move article 10 to its desired position.

As mentioned above, a similar arrangement is utilized in accordance with the present invention to vertical positioning zone signals. The displays representative of the analogous vertical positioning situations are shown in parentheses in FIG. 4.

Figure 5:
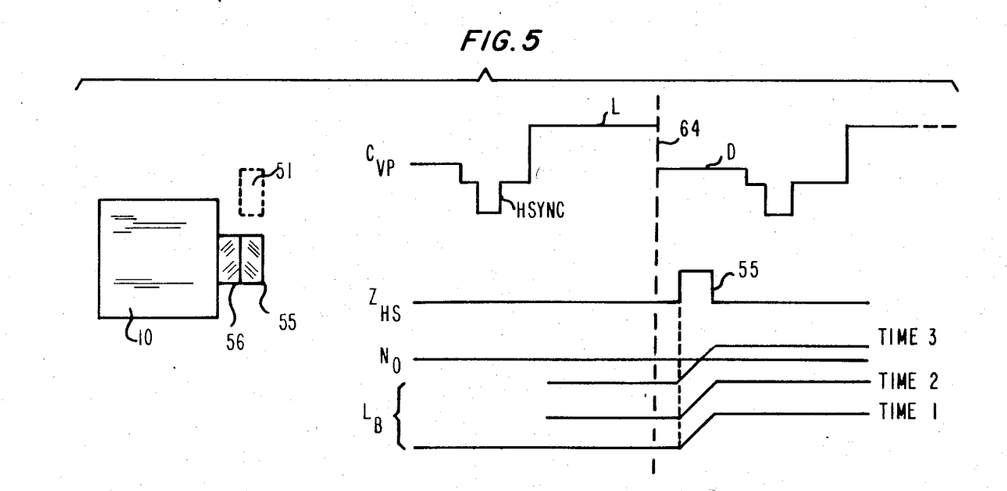
FIG. 5 illustrates wave forms generated to establish the sensitivity of the system shown in FIG. 3.

Referring to FIG. 5, waveforms related to horizontal sensitivity adjustment are illustrated. As shown, horizontal sensitivity zone 55, depicted by horizontal sensitivity pulse $Z_{HS}$, is separated from edge 64 of article 10 by horizontal positioning zone 56. The purpose of the sensitivity measurement is to establish the localized system sensitivity by measurements made in a non-object area 51, non-object signal $B_O$ as defined above in association with FIG. 3. This signal measurement in a non-object zone is defined as the threshold signal utilized to control sensitivity detector 50. When signal $L_B$ produced by linear step charge circuit 48 exceeds signal $N_O$ after a predetermined number of passes, output signal $E_S$ from sensitivity detector tells microprocessor 44 to adjust the theshold of horizontal sensitivity zone detector upward. Conversely, if output signal $E_S$ does not exceed $N_O$ after a predetermined number of passes, the threshold voltage is downwardly adjusted.

Figure 6:
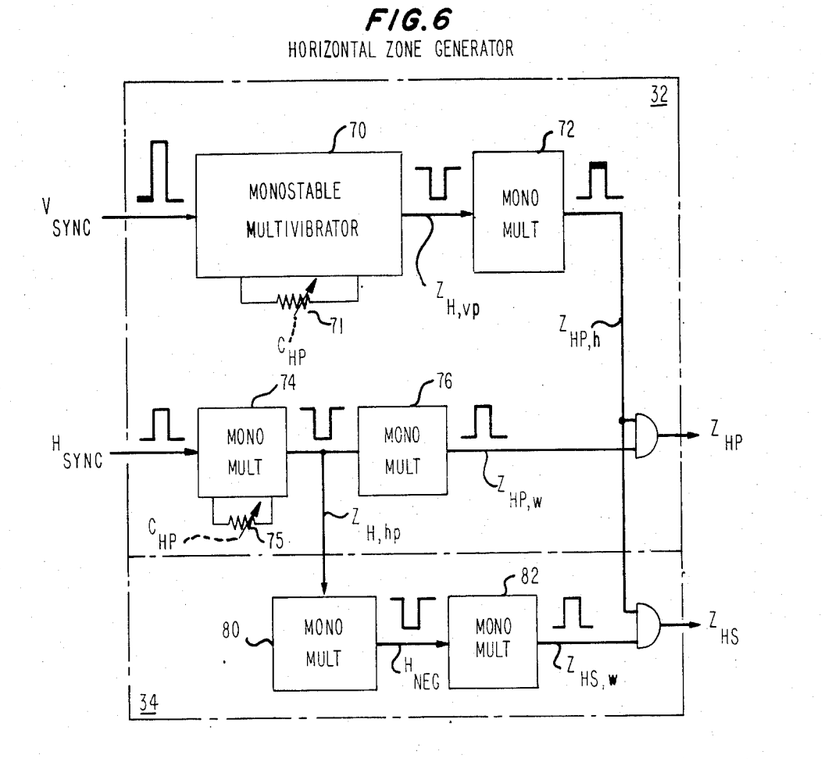
FIG. 6 is a block diagram of an exemplary zone generator which may be used in the circuit of FIG. 3.

An exemplary zone generator circuit 32,34 for generating both the horizontal zone position pulse $Z_{HP}$ and horizontal zone sensitivity pulse $Z_{HS}$ is illustrated in detail in FIG. 6. Vertical synchronization pulse $V_{sync}$, as defined above, is applied as an input to a first monostable multivibrator 70, which triggers on the leading positive going edge of pulse $V_{sync}$ to produce a negative going pulse $Z_{H,vp}$. The duration of pulse $Z_{H,vp}$ is controlled by a variable resistor 71 consisting of a manual control and an automatic control via control signal $C_{HP}$ from microprocessor 44. The duration of pulse $Z_{H,vp}$ determines the vertical position of the horizontal position and sensitivity zones 56,55 on the display. Pulse $Z_{H,vp}$ is applied as an input to a monostable multivibrator 72 which is triggered by the trailing positive going edge of pulse $Z_{H,vp}$ and produces an output pulse $Z_{HP,h}$ of fixed duration. Pulse $Z_{HP,h}$ represents the height of the horizontal position and sensitivity zones 56,55 on the display. Horizontal synchronization pulse $H_{sync}$, as defined above, is applied as an input to a monostable multivibrator 74 which is triggered on the leading edge of pulse $H_{sync}$ and produces a negative going output pulse $Z_{H,hp}$. The duration of pulse $Z_{H,hp}$ is controlled by a variable resistor 75 consisting of a manual control and an automatic control from control signal $C_{HP}$ of microprocessor 44 and represents the horizontal position of zone 56. Pulse $Z_{H,hp}$ is subsequently applied as an input to a monostable multivibrator 76, which is triggered by the trailing edge of pulse $Z_{H,hp}$ and produces a positive going pulse $Z_{HP,w}$ of fixed duration which represents the width of horizontal positioning zone 56 as shown in FIG. 1. Height pulse $Z_{HP,h}$ and width pulse $Z_{HP,w}$ are applied as separated inputs to an AND gate 78, where the overlap of these two signals, results in zone $Z_{HP}$, the output of horizontal position zone generator 32, as described above.

In order to generate horizontal sensitivity zone $Z_{HS}$, output pulse $Z_{H,hp}$ from monostable multivibrator 74 is applied as an input to a monostable multivibrator 80 which is triggered on the positive going trailing edge of $Z_{H,hp}$ to produce a negative going pulse $H_{NEG}$. Pulse $H_{NEG}$ is of a fixed duration slightly less in duration than pulse $Z_{Hp,w}$ to produce minimal coincidence between the positioning and sensitivity zones. Pulse $H_{NEG}$ is subsequently applied as an input to a monostable multivibrator 82, where monostable multivibrator 82 triggers on the positive-going trailing edge of pulse $H_{NEG}$ to produce a positive going pulse $Z_{HS,w}$ of fixed duration corresponding to the width of horizontal sensitivity zone 55. Height pulse $Z_{HP,h}$ and sensitivity width pulse $Z_{HS,w}$ are applied as separate inputs to an AND gate 84 to produce the horizontal sensitivity zone pulse $Z_{HS}$, described above.

In summary, a system has been described for producing two adjoining zones which provide both bidirectional positioning and system sensitivity control. Since position pulse $Z_{HP}$ and sensitivity pulse $Z_{HS}$ have minimal coincidence, they may be logically combined using and OR gate (not shown) to produce a single zone which can be mixed with the composite video signal and displayed on monitor 25. Configuration of zone generators 32,34 as illustrated in FIG. 6 establishes a fixed relationship between the positioning and sensitivity zones and also eliminates the distortion or pulling which normally occurs when utilizing monostable multivibrators. The use of AND gates 78 and 84 provides for the combination of time dependent waveforms and eliminates electronic delay associated with initial starting conditions.

As discussed above, the vertical position and sensitivity zone generators required for vertical circuitry 52 of FIG. 3 are identical to those for the horizontal as illustrated in FIG. 6, with the exception being that the sensitivity zone (zone 53 in FIG. 1) is configured to precede the position zone (zone 54 in FIG. 1), and the position zone is disposed beneath the sensitivity zone.

What is claimed is:

1. A method of positioning an article relative to an apparatus, said article having at least a first edge and a second edge, said method comprising the steps of:
    (a) generating a first video signal ($C_{VS}$) of said article;
    (b) generating a second video signal ($Z_{HP}$) of a first bidirectional boundary marker having adjustable vertical and horizontal dimensions with an edge of said first boundary marker indicating a limit for said first edge of said article;
    (c) generating a third video signal ($Z_{VP}$) of a second bidirectional boundary marker having adjustable vertical and horizontal dimensions with an edge of said second boundary marker indicating a limit for said second edge of said article;
    (d) displaying said first, second, and third video signals simultaneously on a monitor;
    (e) moving said first and second boundary markers to predetermined positions on said monitor;
    (f) sensing a coincidence of said first and second video signals over a predetermined time interval and generating a first output signal when said first and second video signals do not coincide over said time interval, a second output signal when said first and second signals coincide over said time interval, and a third output signal when said first and second video signals overlap during said time interval;
    (g) moving said article in a first direction in response to said first output signal and in a second, opposite direction in response to said third output signal, the motion being directly proportional to the separation distance when said first and second signals do not coincide and the amount of encroachment when said first and second signals overlap;
    (h) sensing a coincidence of said first and third video signals over the predetermined time interval and generating a fourth output signal when said first and third video signals do not coincide over said time interval, a fifth output signal when said first and third signals coincide over said time interval, and a sixth output signal when said first and third video signals overlap during said time interval;
    (i) moving said article in a third direction in response to said third output signal and in a fourth direction opposite of said third direction in response to said sixth output signal, the motion being direction proportional to the separation distance when said first and third signals do not coincide and the amount of encroachment when said first and second signals overlap.

2. A method as recited in claim 1 wherein the first boundary marker is defined as a horizontal bidirectional boundary marker and the first output signal causes the article to be moved in a forward X direction and the third output signal causes said article to be moved in a reverse X direction.

3. A method as recited in claim 1 wherein the second boundary marker is defined as a vertical bidirectional boundary and the fourth output signal causes the article to be moved in a forward Y direction and the sixth output signal causes said article to be moved in a reverse Y direction.

4. A method as recited in claim 1 wherein the first and second boundary markers are mutually perpendicular.

5. A method as recited in claim 1 wherein the method comprises the additional steps of:
    (j) generating a fourth video signal ($Z_{HS}$) of a first sensitivity marker having adjustable vertical and horizontal dimensions with an edge of said first sensitivity marker coinciding with an edge of the first boundary marker which is separated from and parallel with the limit indicating edge of said first boundary marker;
    (k) generating a fifth video signal ($Z_{VS}$) of a second sensitivity marker having adjustable vertical and horizontal dimensions with a edge of said second sensitivity marker coinciding with an edge of the second boundary marker which is separated from and parallel with the limit indicating edge of said second boundary marker;
    (l) displaying said fourth and fifth video markers on the monitor;

(m) sensing a coincidence of said first sensitivity marker and a video signal from a first background area separated from the article;

(n) modifying the sensitivity of the apparatus in response to the sensed coincidence of said first sensitivity marker and said first background area video signal;

(o) sensing a coincidence of said second sensitivity marker and a video signal from a second background area separated from the article;

(p) modifying the sensitivity of said apparatus in response to the sensed coincidence of said second sensitivity marker and said second background area video signal.

6. A method as recited in claim 5 wherein the first sensitivity marker is defined as a horizontal sensitivity marker.

7. A method as recited in claim 5 wherein the second sensitivity marker is defined as a vertical sensitivity marker.

8. Apparatus for positioning an article in an X-Y plane, said article having a least a first edge and a second edge, said apparatus comprising:

means for generating a first video signal of said article;

means for generating a second video signal of a first bidirectional boundary marker having adjustable horizontal and vertical dimensions with an edge of said first boundary marker indicating an X direction limit for said first edge of said article;

means for generating a third video signal of a second bidirectional boundary marker having adjustable horizontal and vertical dimensions with an edge of said second boundary marker indicting a Y direction limit for said second edge of said article;

a monitor for displaying said video signals;

means for moving said first and second boundary markers to predetermined positions on said monitor;

means for sensing a coincidence of said first and second video signals over a predetermined time interval and generating a first output signal when said first and second video signals do not coincide over said time interval, a second output signal when said first and second signals coincide over said time interval, and a third output signal when said first and second signals overlap during said time interval;

means for moving said article in a forward X direction in response to said first output signal and in a reverse X direction in response to said third output signal, the motion being directly proportional to the separation distance between said article and said first boundary marker during said first output signal and the amount of overlap between said article and said first boundary marker during said third output signal;

means for sensing a coincidence of said first and third video signals over a predetermined time interval and generating a fourth output signal when said first and third video signals do not coincide over said time interval, a fifth output signal when said first and third signals coincide over said time interval, and a sixth output signal when said first and third signals overlap during said time interval;

means for moving said article in a forward Y direction in response to said fourth output signal and in a reverse Y direction in response to said sixth output signal, the motion being directly proportional to the separation distance between said article and said second boundary marker during said fourth output signal and the amount of overlap between said article and said second boundary marker during said sixth output signal.

9. Apparatus as defined in claim 8 wherein the apparatus further comprises means for generating a fourth video signal for display of a first sensitivity marker having adjustable vertical and horizontal dimensions with an edge of said first sensitivity marker coinciding with an edge of the first boundary marker which is separated from and parallel to the X limit indicating edge of said first boundary marker;

means for generating a fifth video signal for display of a second sensitivity marker having adjustable vertical and horizontal dimensions with an edge of said second sensitivity marker coinciding with an edge of the second boundary marker which is separated from and parallel to the Y limit indicating edge of said second boundary marker;

means for sensing a coincidence of said first sensitivity marker and a video signal from a first background area separated from the article;

means for modifying the X direction sensitivity of said apparatus in response to the sensed coincidence of said first sensitivity signal and said video signal of said first background area;

means for sensing a coincidence of said second sensitivity marker and a video signal from a second background area separated form the article; and means for modifying the Y direction sensivitity of said apparatus in response to the sensed coincidence of said second sensitivity signal and said video signal of said second background area.

10. Apparatus as defined in claim 8 wherein the means for generating the first video signal of the article comprises:

television camera means for generating a vertical sync signal, a horizontal sync signal, and a first video signal of said article; and sync separation means responsive to the signals generated by said television camera means for providing as a first output signal a composite sync signal including said vertical sync signal and said horizontal sync signal and as a second output signal a DC restored video signal of said article.

11. Apparatus as defined in claim 10 wherein the means for generating the second video signal of the first bidirectional boundary marker and the means for generating the fourth video signal of the first sensitivity marker comprises:

horizontal position zone generating means responsive to said first output signal from said sync separation means for generating as an output said first bidirectional boundary marker video signal; and horizontal sensitivity zone generating means responsive to the output of said horizontal position zone generating means for generating as an output the first sensitivity marker video signal.

12. Apparatus as defined in claim 11 wherein the means for generating the second and fourth video signals further comprises:

a first monostable multivibrator responsive to the vertical sync signal for producing a first output pulse, the duration of said first output pulse controlled by a first variable resistor coupled to said first monostable multivibrator;

a second monostable multivibrator responsive to said first output pulse for producing a second output pulse related to the adjustable height of both the first boundary marker and the first sensitivity marker;

a third monostable multivibrator responsive to the horizontal sync signal for producing a third output pulse, the duration of said third output pulse controlled by a second variable resistor coupled to said third monostable multivibrator;

a fourth monostable multivibrator responsive to said third output pulse for producing a fourth output pulse related to the adjustable width of said first boundary marker;

a first AND gate responsive to said second output pulse and said fourth output pulse for generating as an output said second video signal of said first boundary marker;

a fifth monostable multivibrator responsive to said third output pulse for generating a fifth output pulse which is slightly narrower than said fourth output pulse;

a sixth monostable multivibrator responsive to said fifth output pulse for producing a sixth output pulse related to the adjustable width of said first sensitivity marker; and a second AND gate responsive to said second output pulse and said sixth output pulse for generating as an output said fourth video signal of said first sensitivity marker.

13. Apparatus as defined in claim 10 wherein the means for sensing the coincidence of the first video signal with the second and fourth video signals comprises a horizontal video detector responsive to the DC restored video output signal for the sync separation means for generating as an output a first edge signal representative of said X direction edge of said article;

a first AND gate responsive to the second video signal of the first bidirectional boundary marker and the first edge signal output from said horizontal video detector for generating as an output a horizontal position coincidence output signal;

a second AND gate responsive to the fourth video signal of the first sensitivity marker and said first edge signal for generating an output a horizontal sensitivity coincidence output signal;

a first linear step charge circuit responsive to the horizontal position coincidence output signal from said first AND gate for generating in response thereto a first stepped output signal over the predetermined interval of time;

a second linear step charge circuit responsive to said horizontal sensitivity coincidence output signal from said second AND gate for generating in response thereto a second stepped output signal over said predetermined interval of time;

horizontal position threshold detection means responsive to said first stepped output signal for providing in response thereto the first, second and third output signals of said means for sensing a coincidence of the first and second video signals, said horizontal position threshold detection means providing said first output signal when said first stepped signal is less than a first predetermined threshold value at the end of said time interval, providing said second output signal when said first stepped signal is equal to said first threshold value during said time interval, and providing said third output signal when said first stepped signal exceeds said first threshold value during said time interval; and sensitivity threshold detection means responsive to said second stepped output signal for providing in response thereto the output signal of the means for sensing coincidence of the first sensitivity marker and the first background area video signal.

14. Apparatus as defined in claim 10 wherein the means for generating the third video signal of the second bidirectional boundary marker and the means for generating the fifth video signal of the second sensitivity marker comprises:

vertical position zone generating means responsive to said first output signal from said sync separation means for generating as an output said second bidirectional boundary marker video signal; and vertical sensitivity zone generating means responsive to the output of said vertical positioned zone generating means for generating as an output said second sensitivity marker video signal.

15. Apparatus as defined in claim 14 wherein the means for generating the third and fifth video signals further comprises:

a first monostable multivibrator responsive to the vertical sync signal for producing a first output pulse, the duration of said first output pulse controlled by a first variable resistor coupled to said first monostable multivibrator;

a second monostable multivibrator responsive to said first output pulse for producing a second output pulse related to the adjustable width of both the second boundary marker and the second sensitivity marker;

a third monostable multivibrator responsive to the horizontal sync signal for producing a third output pulse, the duration of said third output pulse controlled by a second variable resistor coupled to said third monostable multivibrator;

a fourth monostable multivibrator responsive to said third output pulse for producing a fourth output pulse related to the adjustable height of said second sensitivity marker;

a first AND gate responsive to second second output pulse and said fourth output pulse for generating as an output said fifth video signal of said second sensitivity marker;

a fifth monostable multivibrator responsive to said third output pulse for generating a fifth output pulse which is slightly narrower than said fourth output pulse;

a sixth monostable multivibrator responsive to said fifth output pulse for producing a sixth output pulse related to the adjustable height of said second boundary marker; and a second AND gate responsive to said second output pulse and said sixth output pulse for generating as an output said third video signal of said second boundary marker.

16. Apparatus as defined in claim 11 wherein the means for sensing the coincidence of the first video signal with the third and fifth video signals comprises:

a vertical video detector responsive to the DC restored video output signal from the sync separation means for generating as an output a second edge signal representative of a Y direction edge of said article;

a first AND gate responsive to the third video signal of the second bidirectional boundary marker and said second edge signal output from said vertical video detector for generating as an output a vertical position coincidence output signal;

a second AND gate responsive to the fifth video signal of the second sensitivity marker and said second edge signal for generating as an output a vertical sensitivity coincidence output signal;

a first linear step charge circuit responsive to said vertical position coincidence output signal from from first AND gate for generating in response thereto a first stepped output signal over the predetermined interval of time;

a second linear step charge circuit responsive to said vertical sensitivity coincidence output signal from said second AND gate for generating in response thereto a second stepped output signal over said predetermined interval of time;

vertical threshold position detection means responsive to said first stepped output signal for providing in response thereto the fourth, fifth, and sixth output signals of said means for sensing a coincidence of the first and third video signals, said vertical position threshold detection means providing said fourth output signal when said second stepped signal is less than a second predetermined threshold value at the end of said time interval, providing said second output signal when said second stepped signal is equal to said second threshold value during said time interval, and providing said sixth output signal when said second stepped signal exceeds said second threshold value during said time interval; and sensitivity threshold detection means responsive to said second stepped output signal for providing in response thereto the output signal of the means for sensing a coincidence of the second sensitivity marker and the second background area video signal.

* * * * *